(12) United States Patent
Xue et al.

(10) Patent No.: US 11,075,064 B2
(45) Date of Patent: Jul. 27, 2021

(54) AMPLIFICATION SYSTEM FOR CONTINUOUSLY ADJUSTING AMPLIFICATION GAIN OF A HIGH FREQUENCY WEAK SIGNAL FOR MASS SPECTROMETERS

(71) Applicant: SHANGHAI YUDA INDUSTRIAL CO., LTD., Shanghai (CN)

(72) Inventors: Bing Xue, Shanghai (CN); Jian Jiang, Shanghai (CN); Jiajia Yu, Shanghai (CN); Xiaojun Qi, Shanghai (CN); Bo Hu, Shanghai (CN)

(73) Assignee: SHANGHAI YUDA INDUSTRIAL CO., LTD., Shanghai (CN)

( * ) Notice: Subject to any disclaimer, the term of this patent is extended or adjusted under 35 U.S.C. 154(b) by 0 days.

(21) Appl. No.: 16/767,141

(22) PCT Filed: Aug. 3, 2018

(86) PCT No.: PCT/CN2018/098472
§ 371 (c)(1),
(2) Date: May 27, 2020

(87) PCT Pub. No.: WO2019/100751
PCT Pub. Date: May 31, 2019

(65) Prior Publication Data
US 2020/0388476 A1 Dec. 10, 2020

(30) Foreign Application Priority Data

Nov. 27, 2017 (CN) .......................... 201711208709.0

(51) Int. Cl.
*H01J 49/02* (2006.01)
*H01J 49/00* (2006.01)
(Continued)

(52) U.S. Cl.
CPC ........ *H01J 49/022* (2013.01); *H01J 49/0036* (2013.01); *H01J 49/40* (2013.01);
(Continued)

(58) Field of Classification Search
CPC ...... H01J 49/022; H01J 49/0036; H01J 49/40; H03F 3/19; H03F 3/50; H03F 3/68;
(Continued)

(56) References Cited

U.S. PATENT DOCUMENTS

| | | | | |
|---|---|---|---|---|
| 2018/0269053 A1* | 9/2018 | Jaeschke et al. | ....... | H01J 49/30 250/281 |
| 2019/0198303 A1* | 6/2019 | Kholomeev et al. | ... | H01J 49/00 250/281 |
| 2021/0082667 A1* | 3/2021 | Zhao et al. | ............. | H01J 37/32 250/492.2 |

* cited by examiner

*Primary Examiner* — Kiet T Nguyen
(74) *Attorney, Agent, or Firm* — Bayramoglu Law Offices LLC

(57) ABSTRACT

An amplification system includes a first amplification module, a second amplification module, a third amplification module I, a fourth amplification module I, a first load, a third amplification module II, a fourth amplification module II and a second load. An output terminal of the first amplification module is connected to an input terminal of the second amplification module; output terminals of the second amplification module are connected to an input terminal of the third amplification module I and an input terminal of the third amplification module II. An output terminal of the third amplification module I is connected to an input terminal of the first load through the fourth amplification module I. An output terminal of the third amplification module II is connected to an input terminal of the second load through the fourth amplification module II.

12 Claims, 6 Drawing Sheets

(51) Int. Cl.
*H01J 49/40* (2006.01)
*H03F 1/02* (2006.01)
*H03F 3/50* (2006.01)

(52) U.S. Cl.
CPC ............. *H03F 1/0288* (2013.01); *H03F 3/50* (2013.01); *H03F 2200/222* (2013.01); *H03F 2200/387* (2013.01); *H03F 2203/21103* (2013.01); *H03F 2203/21139* (2013.01)

(58) Field of Classification Search
CPC . H03F 1/0288; H03F 1/52; H03F 1/56; H03F 2200/261; H03F 2200/451; H03F 2200/444; H03F 2200/222; H03F 2200/387; H03F 2203/21103; H03F 2203/21139
USPC ......................................................... 250/281
See application file for complete search history.

AMPLIFICATION SYSTEM FOR CONTINUOUSLY ADJUSTING AMPLIFICATION GAIN OF A HIGH FREQUENCY WEAK SIGNAL FOR MASS SPECTROMETERS

CROSS REFERENCE TO THE RELATED APPLICATIONS

This application is the national phase entry of International Application No. PCT/CN2018/098472, filed on Aug. 3, 2018, which is based upon and claims priority to Chinese Patent Application No. 201711208709.0, filed on Nov. 27, 2017, the entire contents of which are incorporated herein by reference.

TECHNICAL FIELD

The present disclosure relates to an amplification system that is capable of continuously adjusting amplification gain for analyzing a high frequency weak signal from mass spectrometers.

BACKGROUND

Mass spectrometry is an analytical method that analyzes compositions and structures of substances by measuring the ion mass-to-charge ratio of a test sample. A mass spectrometer is an instrument capable of performing mass spectrometry analysis. The mass spectrometer mainly includes an ion source, a mass analyzer, a detector and a data collection system. The ion source firstly ionizes the sample to be analyzed; and then the mass analyzer separates the ions according to the mass-to-charge ratios by using the difference in motions of different ions in the electric and/or magnetic field; the detector collects the separated ion signals and converts the signals into analog signals; the data collection system digitizes the ion signals and sorts the signals according to m/z values so as to obtain a spectrum. Finally, information of the properties, compositions and structures of the sample can be obtained by analyzing the mass spectrum.

The data collection system in the mass spectrometer is a key component in the mass spectrometer. The data collection system characterizes the ionic strength by digitizing the collected ion signals. However, since the signals output by the detector are relatively weak, the signals are still difficult for the data collection system to detect the ion signals even if they are amplified by electron multipliers or the likes. Therefore, it is necessary to amplify the weak signals from the electron multipliers or the likes and then transmit the amplified signals to the data collection system for analysis. For mass spectrometers, especially time-of-flight mass spectrometers, the sampling interval of the data collection system is generally set in a time scale of nanoseconds or even picoseconds, which is an ultra-high-speed data collection. Based on this, the bandwidth of the amplifier shall not be less than 300 M, that is, the rising time of the amplifier itself must be kept at about 2.0 ns at least.

However, the existing amplifiers have the following shortcomings: 1. the bandwidth is narrow, the high frequency characteristics is not good, and the weak signals cannot be amplified without distortion; 2. the amplification gain is fixed, which cannot be adjusted for different signals, making it impossible to effectively improve the signal-to-noise ratio and dynamic range of the mass spectrum; 3. the power consumption is high, which is not suitable for pre-amplification of the portable mass spectrometer; 4. The anti-interference ability is weak, thus it is impossible to apply the mass spectrometer in a complex electromagnetic environment.

SUMMARY

The present disclosure provides an amplification system for continuously adjusting amplification gain of a high frequency weak signal for mass spectrometers, which has good high frequency characteristics, strong anti-interference ability and low power consumption.

The entire amplification system includes a first amplification module, a second amplification module, a third amplification module I, a fourth amplification module I, a first load, a third amplification module II, a fourth amplification module II and a second load. The output of the first amplification module is connected to the input of the second amplification module, the outputs of which are connected to the third amplification module I and the third amplification module II, respectively. The output of the third amplification module I is connected to the first load through the fourth amplification module I, and the output of the third amplification module II is connected to the second load through the fourth amplification module II.

Preferably, the first amplification module includes a first impedance matching sub-module, a second impedance matching sub-module, a first amplification sub-module, a first DC bias sub-module and a first amplitude-limited protection sub-module. Through the input terminal of the first impedance matching sub-module, the high frequency weak signal is output to the second amplification module through the first amplification sub-module and the second impedance matching sub-module sequentially. The input terminal of the first DC bias sub-module is connected to a first DC power supply, the output of the first DC bias sub-module is connected to the first amplification sub-module, and the first amplitude-limited protection sub-module is connected to the first amplification sub-module.

Similarly, the second amplification module includes a third impedance matching sub-module, a fourth impedance matching sub-module, a second amplification sub-module, a second DC bias sub-module and a second amplitude-limited protection sub-module. The output of the second impedance matching sub-module, also the final output of the first amplification module, is connected to the third impedance matching sub-module, which is connected through the second amplification sub-module to the fourth impedance matching sub-module which is connected to the third amplification module I and the third amplification module II, respectively. A second DC power supply is connected to the second DC bias sub-module, which is further connected to the second amplification sub-module in order to provide a DC bias for the amplifier therein. At last, the second amplitude-limited protection sub-module is connected to the second amplification sub-module.

Preferably, the output of the fourth impedance matching sub-module, also the final output of the second amplification module, is connected to the third amplification module I, which is further connected through the fourth amplification module I to the first load. Respectively, the output of the fourth impedance matching sub-module, also the final output of the second amplification module, is connected to the third amplification module II, which is further connected through the fourth amplification module II to the second load.

Preferably, the first amplification module, the second amplification module, the third amplification module I, the fourth amplification module I, the third amplification module II and the fourth amplification module II are all monolithic microwave integrated circuit (MMIC) devices.

Preferably, the third amplification modules I and II, the fourth amplification modules I and II have the same structure as that of the first amplification module.

Preferably, the first amplification module is based on an MSA-02 chip.

Compared with the prior art, the disclosed technical solutions have the following beneficial effects: the preamplifier could not only meet the requirements on time resolution of the readout electronics of the mass spectrometers, especially the time-of-flight mass spectrometer, but also each amplification module including sub-module can continuously amplify weak signals with different combinations of gains, thereby increasing the dynamic range of the mass spectrometer from 3 orders of magnitude to 6 orders, which greatly improves the sensitivity of the mass spectrometer. Furthermore, employing two channel outputs of baluns effectively suppresses generation of even harmonics, which achieves high-frequency and low-noise performance.

DETAILED DESCRIPTION

The present disclosure will be described in detail below with reference to specific embodiments. The following embodiments are described for facilitating those skills in the art to further understand the present disclosure, but do not intend to limit the present disclosure in any way. It should be noted that, for those of ordinary skill in the art, several variations and improvements can be made without departing from the concept of the present disclosure, all of which belong to the protection scope of the present disclosure.

Figure 1:
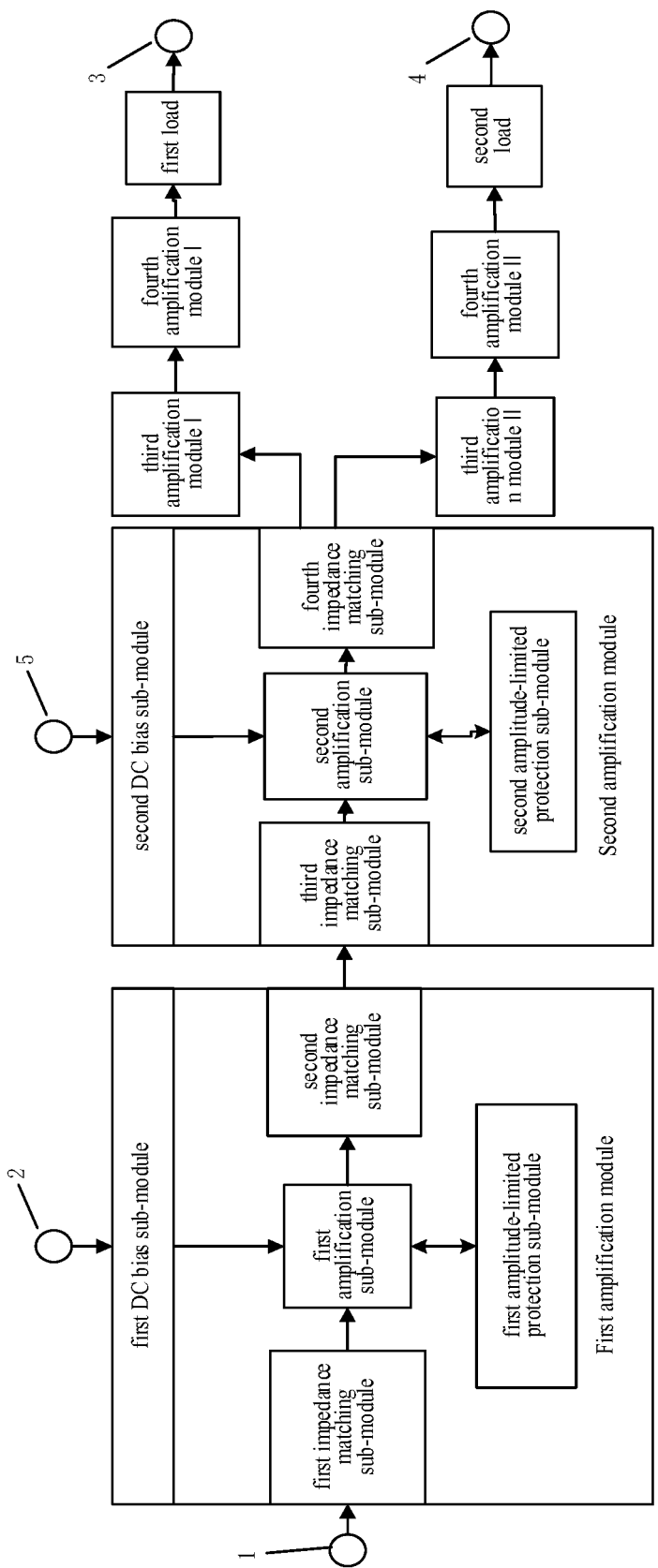
FIG. 1 is a structural block diagram of an amplifier for continuously adjusting amplification of a high frequency weak signal for mass spectrometers according to an embodiment of the present disclosure.

As shown in FIG. 1, an embodiment of the present disclosure provides an amplification system for continuously adjusting amplification of a high frequency weak signal for mass spectrometers, including a first amplification module, a second amplification module, a third amplification module I, a fourth amplification module I, a first load, a third amplification module II, a fourth amplification module II and a second load. The output of the first amplification module is connected to the second amplification module, which is connected to the third amplification module I and the third amplification module II, respectively. The third amplification module I is further connected to through the fourth amplification module I to the first load. And the third amplification module II is further connected through the fourth amplification module II to the second load. The first amplification module includes a first impedance matching sub-module, a second impedance matching sub-module, a first amplification sub-module, a first DC bias sub-module and a first amplitude-limited protection sub-module. Through the input terminal of the first impedance matching sub-module, the high frequency weak signal is output to the second amplification module through the first amplification sub-module and the second impedance matching sub-module sequentially. The input terminal of the first DC bias sub-module is connected to a first DC power supply, the output of the first DC bias sub-module is connected to the first amplification sub-module, and the first amplitude-limited protection sub-module is connected to the first amplification sub-module. The second amplification module includes a third impedance matching sub-module, a fourth impedance matching sub-module, a second amplification sub-module, a second DC bias sub-module and a second amplitude-limited protection sub-module. Each sub-module has at least one input terminal and one output terminal. The output of the second impedance matching sub-module, also the final output of the first amplification module, is connected to the third impedance matching sub-module, which is connected through the second amplification sub-module to the fourth impedance matching sub-module which is connected to the third amplification module I and the third amplification module II, respectively. A second DC power supply is connected to the second DC bias sub-module, which is further connected to the second amplification sub-module in order to provide a DC bias for the amplifier therein. At last, the second amplitude-limited protection sub-module is connected to the second amplification sub-module.

The output of the second amplification module is connected to the third amplification module I and the third amplification module II through two microstrip baluns (not shown in FIG. 1).

The first amplification module, the second amplification module, the third amplification module I, the fourth amplification module I, the third amplification module II and the fourth amplification module II are all monolithic microwave integrated circuit (MMIC) devices. The third amplification module I, the third amplification module II, the fourth amplification module I and fourth amplification module II have the same structure as that of the first amplification module, which could be based on an MSA-02 chip. The MSA-02 chip is a cascaded 50-ohm gain module, wherein a 3 db bandwidth thereof is DC-2.6 GHz, and a typical gain of 1 GHz is 13 db, which is unconditionally stable.

Figure 4:
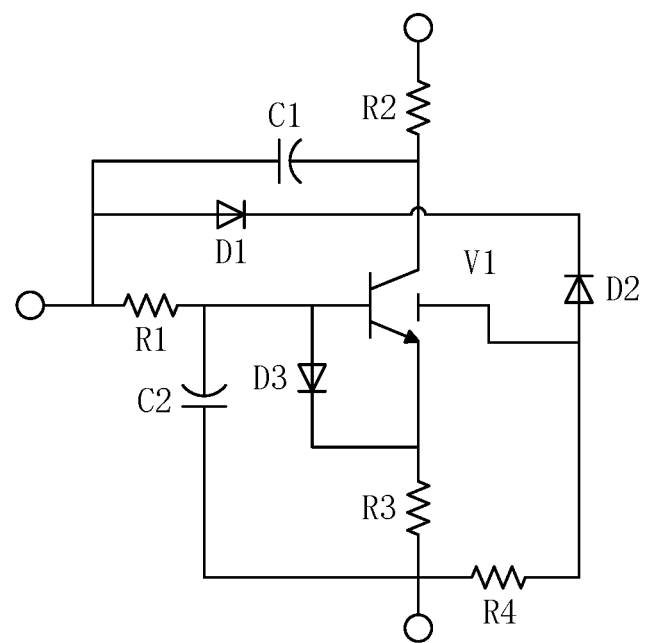
FIG. 4 is a circuit schematic diagram of the first amplification module in an embodiment of the present disclosure.

As shown in FIG. 4, the operation principle of the first amplification module in the embodiment of the present disclosure lies in the usage of a clamping function of a fast diode. When the output voltage is less than a turn-on voltage of the diodes, the diode D1 is turned off, the diode D2 is turned on, and an output voltage of the amplifier is output. When the output voltage is greater than the turn-on voltage of the diode, the diode D2 is turned off, the diode D1 is turned on, and the turn-on voltage of the diode is output.

Embodiments

As shown in FIG. 1, an amplification system for continuously adjusting amplification gain for a high frequency weak signal of a mass spectrometer includes the high frequency weak signal input terminal 1, which is connected to the first amplification module. The first amplification module includes the first power supply 2 which is connected to the first DC bias sub-module, wherein, the first DC bias sub-module is to provide a necessary DC bias for the first amplification sub-module, and the first amplification sub-module also performs impedance matching and amplitude-limited protection on the signals. The first amplification module is connected to the second amplification module, which is connected to third amplification module A/B in a manner of two-way microstrip baluns (not shown), the third amplification module A/B is connected to the fourth amplification module A/B, respectively, which further transfer the amplified signal to terminal 3 and 4 through each corresponding load. By employing two-way output of balun, the generation of even harmonics is effectively suppressed and a low noise performance is achieved.

Figure 2:
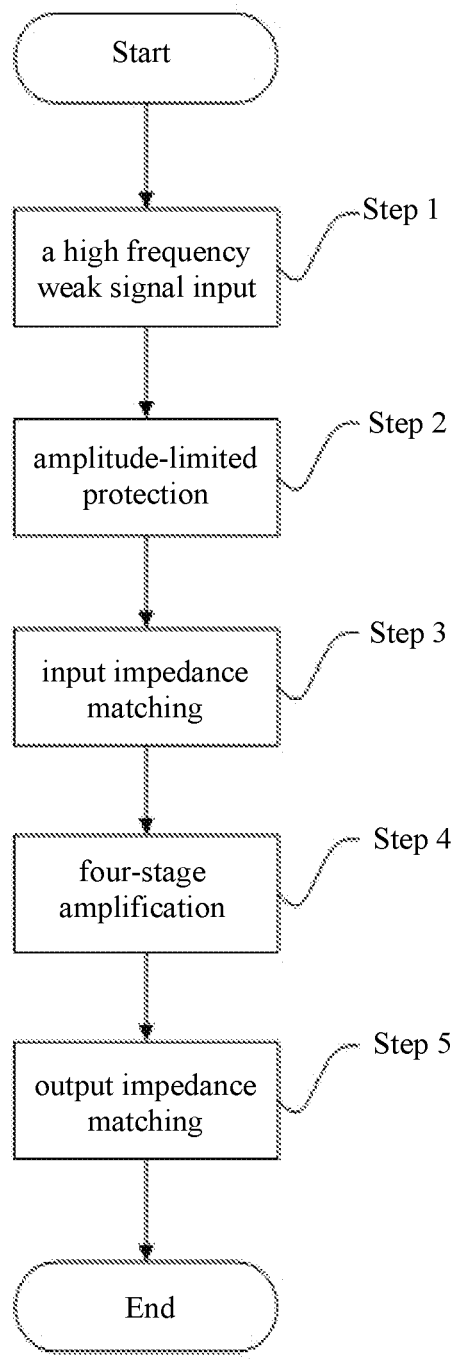
FIG. 2 is an operation flowchart of an embodiment of the present disclosure.

Referring to FIG. 2, the principle and working steps of the present disclosure are as follows:

Step 1), a high frequency weak signal is applied to the high frequency input terminal;

Step 2), the input signal is amplitude-limited by a resistor in the first amplification module;

Step 3), the signal is then impedance-matched in order to prevent reflection;

Step 4), the high frequency weak signal is amplified in cascade by a four-stage MMIC (monolithic microwave integrated device), in which the amplification gain could be continuously adjustable, specifically 1-500 could be obtained by just adjusting the voltage of the power supply voltage from 20V to 29V continuously;

Step 5), finally, the amplified signal is impedance-matched and then output to the data collection system of the mass spectrometer.

Figure 3:
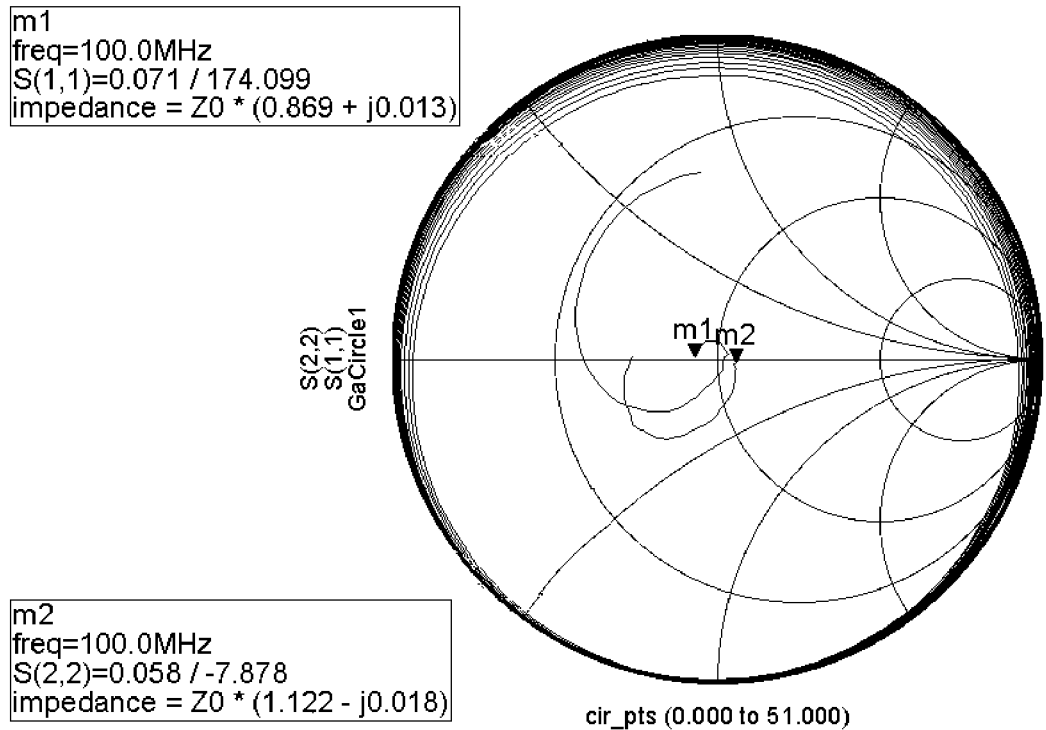
FIG. 3 is a Smith chart of an input impedance matching simulation and an output impedance matching simulation of an amplifier according to an embodiment of the present disclosure.

FIG. 3 is a Smith chart of an input impedance matching simulation and an output impedance matching simulation of an amplifier according to the present disclosure: the results show that the input impedance is $Z0*(0.869+j0.013)$, and the output impedance is $Z0*(1.122-j0.018)$, where $Z0=50\Omega$, satisfying $50\Omega$ impedance matching.

Figure 5:
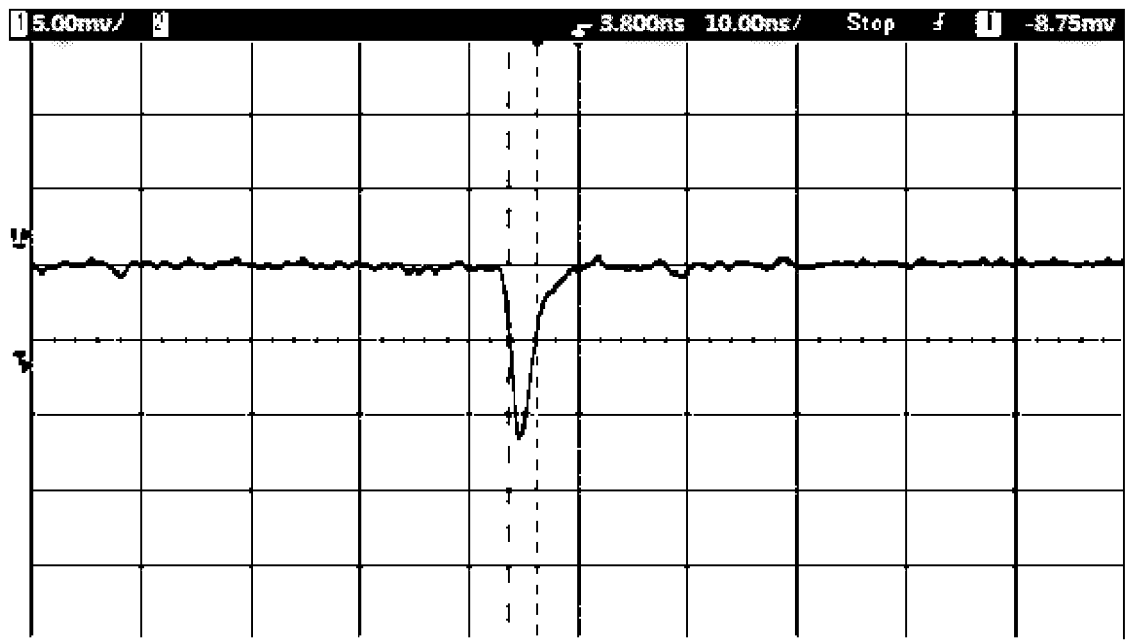
FIG. 5 is a single ion spectrogram of a time-of-flight mass spectrometer in an embodiment of the present disclosure.

FIG. 5 is a spectrum of a single ion obtained using a time-of-flight mass spectrometer in the present disclosure, where the peak amplitude is 11 my and the full width at half maximum (FWHM) is 2.6 ns.

Figure 6:
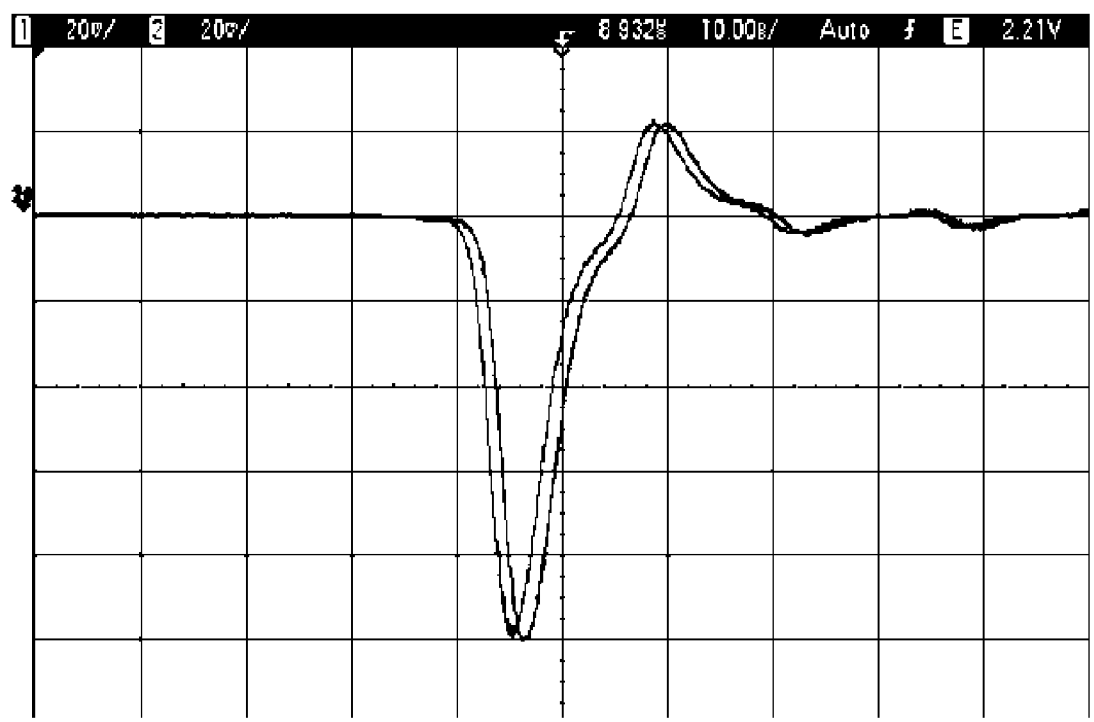
FIG. 6 is a diagram illustrating two signals output simultaneously after amplifying a single particle signal 10 times according to the present disclosure.

FIG. 6 gives the signal outputs generated by a single ionized particle with amplification gain of 10 as a result of application of one disclosed embodiment. It could be seen that the FWHM of the signal remains the same, which satisfies the time resolution of TOF electronics readout. And the two output signals are basically coincident.

Figure 7:
FIG. 7 is a diagram illustrating one signal output after amplifying a single particle signal 40 times according to of the present disclosure.

FIG. 7 shows the signal output formed by a single ionized particle with amplification gain of 40, as a result of application of one disclosed embodiment, in which it could be seen that the FWHM remains unchanged and without any distortion.

Figure 8:
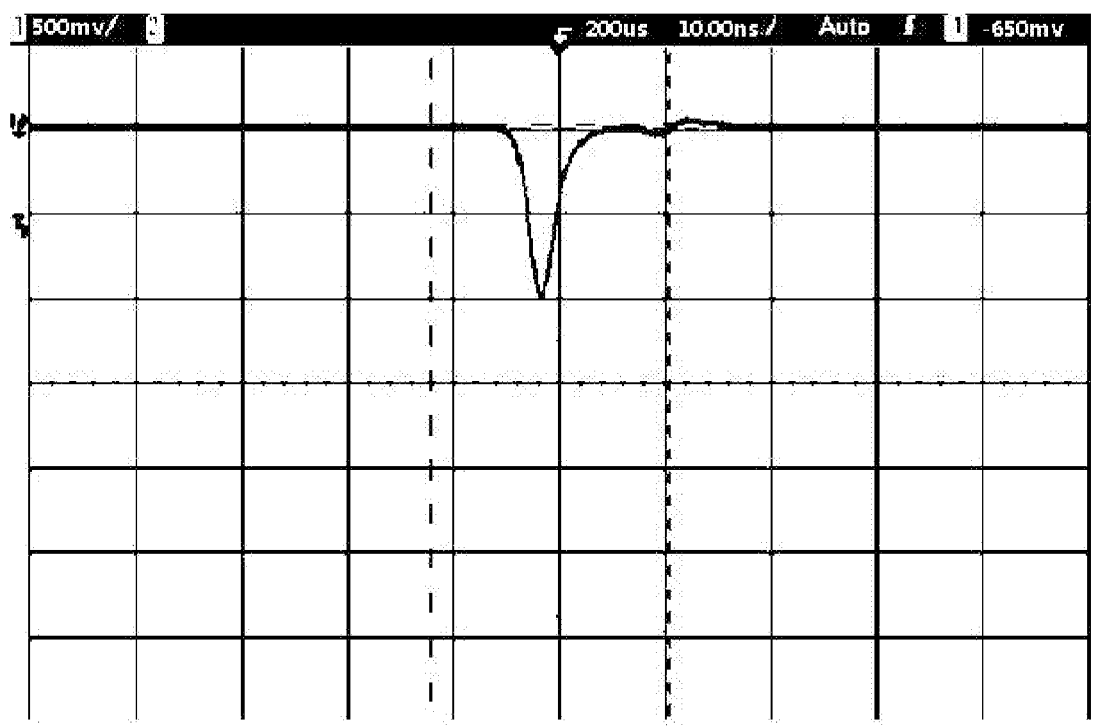
FIG. 8 is a diagram illustrating one signal output after amplifying a single particle signal 100 times according to of the present disclosure.
Figure 9:
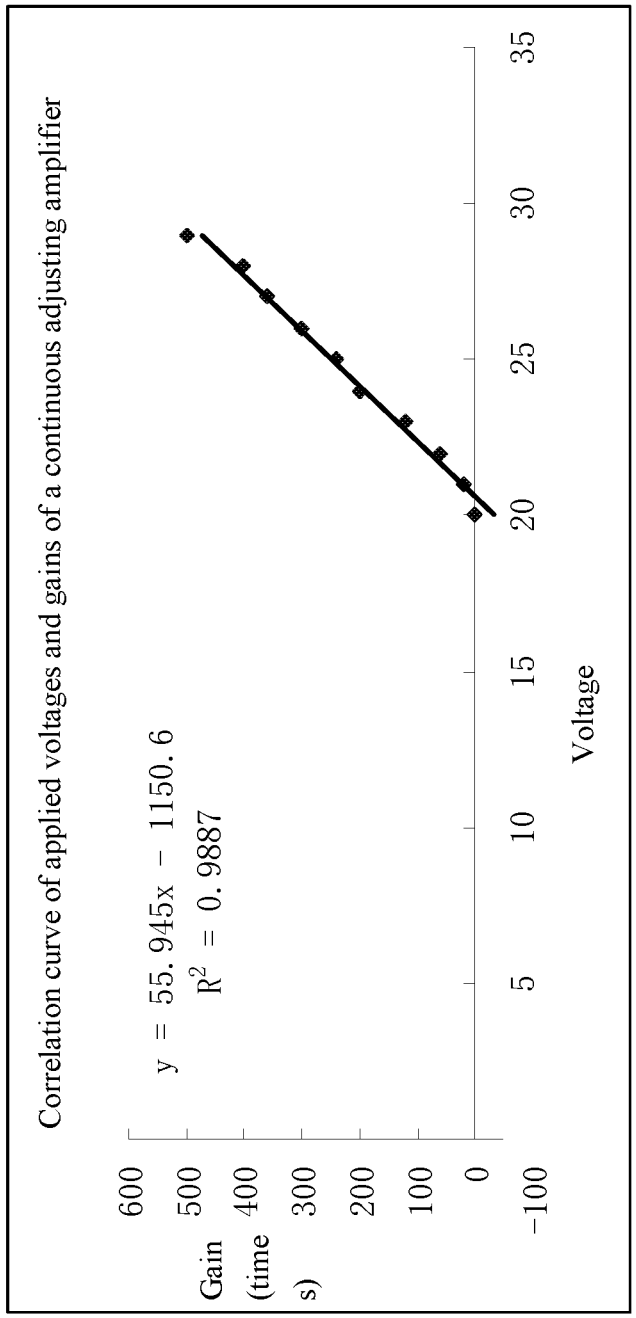
FIG. 9 is a diagram illustrating a relationship between the voltage and gain of an amplifier continuously adjusting gain of 1-500 times in the present disclosure.

FIG. 8 is a diagram of a signal output given by a single ionized particle with amplification gain of 100, as a result of application of one disclosed embodiment, in which it could be seen that the FWHM is unchanged and without any distortion.

From the analysis of the results of FIGS. 5-8, it is concluded that 1. the output signal could be amplified without any distortion using any desired gain. 2. From the amplification effects, two output channels basically give coincident results, which demonstrate the compress effect of even harmonics by applying the Balun structure, and therefore giving low-noise performance.

Various other modifications and variations of the described method of the invention will be apparent to those skilled in the art without departing from the scope and spirit of the invention. Although the invention has been described in connection with specific preferred embodiments, it should be understood that the invention as claimed should not be unduly limited to such specific embodiments.

What is claimed is:

1. An amplification system for continuously adjusting amplification gain of a high frequency weak signal for mass spectrometers, comprising a first amplification module, a second amplification module, a third amplification module I, a fourth amplification module I, a first load, a third amplification module II, a fourth amplification module II and a second load, wherein, an output terminal of the first amplification module is connected to an input terminal of the second amplification module; a first output terminal of the second amplification module is connected to an input terminal of the third amplification module I, and a second output terminal of the second amplification module is connected to an input terminal of the third amplification module II, respectively; an output terminal of the third amplification module I is connected to an input terminal of the first load through the fourth amplification module I; and an output terminal of the third amplification module II is connected to an input terminal of the second load through the fourth amplification module II.

2. The amplification system in claim 1, wherein, the first amplification module comprises a first impedance matching sub-module, a second impedance matching sub-module, a first amplification sub-module, a first DC bias sub-module and a first amplitude-limited protection sub-module.

3. The amplification system in claim 2, wherein an input of the first impedance matching sub-module is used as an input terminal of the first amplification module; and an output of the second impedance matching sub-module is used as the output terminal of the first amplification module.

4. The amplification system in claim 2, wherein the first impedance matching sub-module is connected to the first amplification sub-module; the first amplification sub-module is connected to the second impedance matching sub-module; the first DC bias sub-module is connected to the first amplification sub-module; and the first amplitude-limited protection sub-module is connected to the first amplification sub-module.

5. The amplification system in claim 2, wherein the first DC bias sub-module is connected to a first DC power supply.

6. The amplification system in claim 1, wherein, the second amplification module comprises a third impedance matching sub-module, a fourth impedance matching sub-module, a second amplification sub-module, a second DC bias sub-module and a second amplitude-limited protection sub-module.

7. The amplification system in claim 6, wherein an input of the third impedance matching sub-module is used as the input terminal of the second amplification module; outputs of the fourth impedance matching sub-module are used as output terminals of the second amplification module.

8. The amplification system in claim 6, wherein the third impedance matching sub-module is connected to the second amplification sub-module; the second amplification sub-module is connected to the fourth impedance matching sub-module; the second DC bias sub-module is connected to the second amplification sub-module; and the second amplitude-limited protection sub-module is connected to the second amplification sub-module.

9. The amplification system in claim 6, wherein the second DC bias sub-module is connected to a second DC power supply.

10. The amplification system in claim 1, wherein the first amplification module, the second amplification module, the third amplification module I, the fourth amplification module I, the third amplification module II and the fourth amplification module II are all monolithic microwave integrated circuit (MMIC) devices.

11. The amplification system in claim 1, wherein the third amplification module I, the fourth amplification module I, the third amplification module II and the fourth amplification module II are structurally identical to the first amplification module.

12. The amplification system in claim 1, wherein the first amplification module is based on an MSA-02 chip.

* * * * *